United States Patent
Iida et al.

(10) Patent No.: US 8,491,834 B2
(45) Date of Patent: Jul. 23, 2013

(54) LAMINATE TYPE CERAMIC ELECTRONIC COMPONENT AND METHOD FOR MANUFACTURING SAME

(75) Inventors: Yuichi Iida, Nagaokakyo (JP); Yusuke Otsuka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 251 days.

(21) Appl. No.: 13/181,572

(22) Filed: Jul. 13, 2011

(65) Prior Publication Data

US 2011/0266036 A1 Nov. 3, 2011

Related U.S. Application Data

(63) Continuation of application No. PCT/JP2010/050323, filed on Jan. 14, 2010.

(30) Foreign Application Priority Data

Jan. 20, 2009 (JP) ................... 2009-009516

(51) Int. Cl.
*C04B 33/32* (2006.01)
(52) U.S. Cl.
USPC ........................ 264/614; 65/33.5; 156/89.12
(58) Field of Classification Search
USPC ....................................... 264/614
See application file for complete search history.

(56) References Cited

U.S. PATENT DOCUMENTS 6,544,654 B1   4/2003   Fukaya et al.

FOREIGN PATENT DOCUMENTS

| JP | 08-250623 A | 9/1996 |
| JP | 09-130043 A | 5/1997 |
| JP | 11-251723 A | 9/1999 |
| JP | 2001-322831 A | 11/2001 |
| JP | 2005-039164 A | 2/2005 |
| JP | 2005-174953 A | 6/2005 |
| JP | 2008-277628 A | 11/2008 |

OTHER PUBLICATIONS

JP 2005-174953 A (Kashima) Jun. 30, 2005 (English language machine translation of reference cited in IDS dated Jul. 13, 2011). [online] [retrieved May 9, 2013]. Retrieved from: Advanced Industrial Property Network Japan Patent Office.*

(Continued)

*Primary Examiner* — Joseph S Del Sole
*Assistant Examiner* — Erin Snelting
(74) *Attorney, Agent, or Firm* — Keating & Bennett, LLP

(57) ABSTRACT

A laminate type ceramic electronic component includes a thick film resistor and an overcoat layer so as to prevent defects such as delamination from being caused and to prevent the thick film resistor from being cracked after laser trimming, even when a method is adopted in which an unfired composite laminate is subjected to firing in such a way that an unfired ceramic laminate, an unfired thick film resistor, and an unfired overcoat layer are each integrally sintered. The unfired overcoat layer includes a glass ceramic material containing a ceramic and glass having substantially the same constituents and compositional ratio as those of the glass contained in the unfired ceramic layer. The respective glass ceramic materials constituting the unfired ceramic layer and the unfired overcoat layer are adjusted so that the ratio of a crystalline phase with a smaller coefficient of thermal expansion than the coefficient of thermal expansion of the fired ceramic layer is higher in the overcoat layer than in the ceramic layer.

7 Claims, 1 Drawing Sheet

OTHER PUBLICATIONS

JP 2005-039164 A (Yamamoto) Feb. 10, 2005 (English language machine translation of reference cited in IDS dated Jul. 13, 2011). [online] [retrieved May 9, 2013]. Retrieved from: Advanced Industrial Property Network Japan Patent Office.*

Official Communication issued in International Patent Application No. PCT/JP2010/050323, mailed on Feb. 16, 2010.

* cited by examiner

LAMINATE TYPE CERAMIC ELECTRONIC COMPONENT AND METHOD FOR MANUFACTURING SAME

BACKGROUND OF THE INVENTION

1. Field of the Invention

The present invention relates to a laminate type ceramic electronic component and a method for manufacturing the laminate type ceramic electronic component, and more particularly, relates to a laminate type ceramic electronic component including a multilayer ceramic substrate, a thick film resistor located on one principal surface of the multilayer ceramic substrate, and an overcoat layer located on the thick film resistor, and a method for manufacturing the laminate type ceramic electronic component.

2. Description of the Related Art

In the case of the formation of a resistor composed of a thick film on the surface of a ceramic substrate, the resistor is covered with overcoating of a glass based material for the purpose of protecting the resistor and improving the environmental resistance. While the resistor covered with the overcoating has a resistance value subjected to a fine adjustment with the use of an approach such as laser trimming, the resistor may have cracks caused after the laser trimming because an extremely strong thermal shock is applied to the resistor during the laser trimming. The resistor containing cracks cannot keep the resistance value stable.

The techniques which can solve this problem are described in, for example, Japanese Patent Application Laid-Open No. 8-250623 and Japanese Patent Application Laid-Open No. 2001-322831.

In the case of Japanese Patent Application Laid-Open No. 8-250623, in a method for manufacturing a ceramic substrate, which includes the respective steps of applying a resistor on the surface of a fired ceramic substrate, and further overcoat glass thereon, and subjecting the resistor and the overcoat glass to cofiring, the coefficient of thermal expansion of the resistor is set to be not less than the coefficient of thermal expansion of the overcoat glass so that the resistor has no cracks caused due to a thermal shock during laser trimming.

In the case of Japanese Patent Application Laid-Open No. 2001-322831, in a method for manufacturing a ceramic substrate substantially as in Japanese Patent Application Laid-Open No. 8-250623, the coefficient of thermal expansion of the overcoat glass is set to be lower than the coefficient of thermal expansion of the ceramic substrate so that the resistor has no cracks caused due to a thermal shock during laser trimming.

It is common that the resistor and the overcoat glass are formed by a post-fire process such as being sequentially applied on the surface of a fired ceramic substrate and subjected to firing, as described in Japanese Patent Application Laid-Open No. 8-250623 and Japanese Patent Application Laid-Open No. 2001-322831 described above. However, the adoption of the post-fire process increases the frequency of firing, and causes a problem of difficulty in the formation of fine patterns.

In order to achieve a reduction in the frequency of firing, the resistor and the overcoat glass may be subjected to cofiring with the ceramic substrate. However, in this case, when the behavior during the firing varies greatly between the ceramic substrate material and the overcoat material, it has to be considered that defects such as delamination and warpage of the substrate are more likely to be caused.

For the purpose of a reduction in the frequency of firing, the cofiring of the resistor and the overcoat glass with the ceramic substrate is described in, for example, Japanese Patent Application Laid-Open No. 2005-039164 and Japanese Patent Application Laid-Open No. 2005-174953.

Japanese Patent Application Laid-Open No. 2005-039164 discloses the formation of a conductor, a resistor, and overcoat glass on one principal surface of an unfired ceramic laminate with a plurality of glass ceramic green sheets stacked, further, the placement of a constrained layer containing, as its main constituent, a ceramic material which is not substantially sintered at a temperature at which the unfired ceramic laminate is sintered on the both principal surfaces of the ceramic laminate, and the firing of the unfired ceramic laminate with the conductor, the resistor, and the overcoat glass formed, as well as the constrained layers placed, which is carried out on the basis of a non-shrinkage cofiring process.

In addition, Japanese Patent Application Laid-Open No. 2005-039164 discloses, as preferred embodiments, that the glass component contained in the overcoat glass contains crystallized glass, the softening temperature of the glass component contained in the overcoat glass is higher than the softening point of the glass component contained in the resistor and the glass ceramic green sheets, and the glass component contained in the overcoat glass contains $SiO_2$, $Bi_2O_3$, and $B_2O_3$.

However, in the technique described in Japanese Patent Application Laid-Open No. 2005-039164, when the preferred embodiments as described above are to be adopted, there is a need for the use of various types of glass that are different from each other between the substrate material and the overcoat material, and a difference is thus caused in shrinkage behavior in the non-shrinkage co-firing process, thereby causing the problem of difficulty in the integration of the substrate material and the overcoat material.

On the other hand, Japanese Patent Application Laid-Open No. 2005-174953 discloses that an unfired circuit board with a resistor and a surface layer conductor covered with ceramic green covering layers is sandwiched between constrained sheets and subjected to cofiring. In this case, the ceramic green covering layers mentioned above are constituted by a ceramic paste applied layer and a ceramic green sheet which are to be integrated by the cofiring into the unfired circuit board. In addition, the ceramic paste applied layers and ceramic green sheets constituting the ceramic green covering layers are supposed to have substantially the same composition as the ceramic green sheets constituting the unfired circuit board. In addition, among the ceramic green covering layers, the ceramic covering layer covering the surface layer conductor is removed along with the constrained sheets after firing in such a way that the surface layer conductor is thereby exposed at the surface of the substrate.

However, in the case of the technique described in Japanese Patent Application Laid-Open No. 2005-174953, the ceramic paste applied layers and ceramic green sheets constituting the ceramic green covering layers have substantially the same composition as the ceramic green sheets constituting the unfired circuit board, and there is thus no difference in coefficient of thermal expansion between the ceramic green covering layers and the unfired circuit board, thereby making cracks more likely to be caused after laser trimming, and possibly leading to a problem of difficulty in controlling the resistance value of the resistor stably. In particular, in the case of forming no overcoat layers on the ceramic green covering layers, this problem will be more significant.

SUMMARY OF THE INVENTION

Preferred embodiments of the present invention provide a method for manufacturing a laminate type ceramic electronic component and a laminate type ceramic electronic component obtained by the manufacturing method, which solve the problems described above.

According to a preferred embodiment of the present invention, a method for manufacturing a laminate type ceramic electronic component includes the steps of: preparing an unfired composite laminate with an unfired thick film resistor formed on one principal surface of an unfired ceramic laminate including a plurality of unfired ceramic layers stacked on each other, and further an unfired overcoat layer formed thereon; and then firing the unfired composite laminate so that the unfired ceramic laminate, the unfired thick film resistor and the unfired overcoat layer are integrally sintered.

In the method for manufacturing a laminate type ceramic electronic component according to a preferred embodiment of the present invention, the unfired ceramic layers are made of a glass ceramic material containing glass and a ceramic, the unfired overcoat layer is made of a glass ceramic material containing a ceramic and glass with substantially the same constituents and compositional ratio as those of the glass contained in the unfired ceramic layers, and the glass ceramic material constituting the unfired ceramic layers and the glass ceramic material constituting the unfired overcoat layer are adjusted so that the ratio of a crystalline phase with a smaller coefficient of thermal expansion than the coefficient of thermal expansion of the fired ceramic layers is higher in the overcoat layer than in the ceramic layers.

In the method for manufacturing a laminate type ceramic electronic component according to a preferred embodiment of the present invention, the glass ceramic material constituting the unfired ceramic layer and the glass ceramic material constituting the unfired overcoat layer are preferably adjusted so that the crystallization temperature of the unfired overcoat layer is higher than the crystallization temperature of the unfired ceramic layers.

In the preferred embodiment described above, more preferably, the unfired ceramic layers and the unfired overcoat layer include a seed crystal containing a crystalline phase deposited in the fired ceramic layer and overcoat layer after the firing, and the ratio by weight of the seed crystal in the unfired ceramic layers and the ratio by weight of the seed crystal in the overcoat layer are adjusted to make the crystallization temperature of the unfired overcoat layer higher than the crystallization temperature of the unfired ceramic layers.

A sintered body of the same material as the fired ceramic layers is preferably subjected to grinding, and used as the seed crystal.

In addition, in the method for manufacturing a laminate type ceramic electronic component according to a preferred embodiment of the present invention, the grain size for the ceramic in the unfired ceramic layers and the grain size for the ceramic in the unfired overcoat layer may be adjusted so that the ratio of a crystalline phase with a smaller coefficient of thermal expansion than the coefficient of thermal expansion of the fired ceramic layers is made higher in the overcoat layer than in the ceramic layers.

In the method for manufacturing laminate type ceramic electronic component according to a preferred embodiment of the present invention, the unfired overcoat layer is preferably formed so as to entirely cover one principal surface of the unfired ceramic laminate.

In addition, in the method for manufacturing the laminate type ceramic electronic component according to a preferred embodiment of the present invention, preferably, the unfired composite laminate further includes a constrained layer placed on at least one principal surface of the unfired composite laminate, and the constrained layer includes, as its main constituent, a ceramic material which is not substantially sintered at a temperature at which the unfired ceramic layers and the unfired overcoat layer are sintered, and the method further includes a step of removing the constrained layer after the step of firing the unfired composite laminate.

According to another preferred embodiment of the present invention, a laminate type ceramic electronic component includes a multilayer ceramic substrate including a plurality of ceramic layers stacked on each other, a thick film resistor located on one principal surface of the multilayer ceramic substrate, and an overcoat layer located on the thick film resistor. The laminate type ceramic electronic component according to various preferred embodiments of the present invention is characterized by including the following aspects.

More specifically, the ceramic layers are preferably made of a glass ceramic material containing glass and a ceramic, the overcoat layer is made of a glass ceramic material containing glass with substantially the same constituents and compositional ratio as those of the glass contained in the ceramic layers and containing a ceramic, and the ratio of a crystalline phase with a smaller coefficient of thermal expansion than the coefficient of thermal expansion of the ceramic layers is higher in the overcoat layer than in the ceramic layers.

In the laminate type ceramic electronic component according to a preferred embodiment of the present invention, the overcoat layer is preferably arranged so as to entirely cover one principal surface of the multilayer ceramic substrate.

According to various preferred embodiments of the present invention, the ceramic layers and the overcoat layer each using the same glass prevent and minimize fluctuations in mechanical properties (such as the strength and the coefficient of thermal expansion) and electrical properties (such as the Q value and the specific dielectric constant), even when diffusion of the glass is caused between the multilayer ceramic substrate and the overcoat layer. In addition, the glass can be easily managed advantageously in terms of cost. Furthermore, delamination, warpage of the substrate, etc., which are caused by a difference in shrinkage behavior, are prevented.

In addition, since the coefficient of thermal expansion for the overcoat layer is lower than the coefficient of thermal expansion for the multilayer ceramic substrate, the surface of the multilayer ceramic substrate experiencing a compressive stress is prevented from having cracks after laser trimming for the thick film resistors, thus making it possible to reliably and stably maintain an accurate resistance value.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
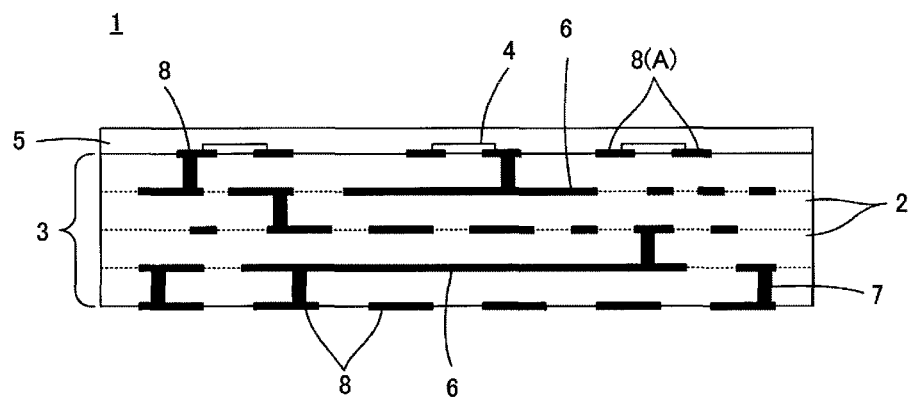
FIG. 1 is a cross-sectional view schematically illustrating a laminate type ceramic electronic component 1 according to a preferred embodiment of the present invention.

First, the structure of a laminate type ceramic electronic component 1 according to a preferred embodiment of the present invention will be described with reference to FIG. 1.

The laminate type ceramic electronic component 1 includes a multilayer ceramic substrate 3 including a plurality of stacked ceramic layers 2, a thick film resistor 4 located on one principal surface of the multilayer ceramic substrate 3, and further an overcoat layer 5 located on the thick film resistor 4.

The multilayer ceramic substrate 3 includes wiring conductors. The wiring conductors are intended to constitute passive elements, for example, such as capacitors and inductors, or to provide connection wiring such as electrical connections between elements. The wiring conductors include several in-plane wiring conductors 6 and interlayer connecting conductors 7 provided in the multilayer ceramic substrate 3, and several surface conductors 8 provided on the outer surfaces of the multilayer ceramic substrate 3, and among the surface conductors 8, specific ones are used as resistive connecting conductors 8(A).

The ceramic layers 2 included in the multilayer ceramic substrate 3 are preferably made of a glass ceramic material containing glass and a ceramic. The overcoat layer 5 is made of a glass ceramic material containing a ceramic and glass having substantially the same constituents and compositional ratio as those of the glass contained in the ceramic layers 2. In this case, the ceramic contained in the glass ceramic material constituting the overcoat layer 5 may be the same type of a ceramic as, or may be a different type of a ceramic from, the ceramic contained in the glass ceramic material constituting the ceramic layers 2. It is to be noted that the term "the glass with substantially the same constituents and compositional ratio" means "glass which causes no fluctuation in mechanical properties or electrical properties in the ceramic layers or the overcoat layer, even when the constituents of the glass cause interdiffusion between the ceramic layers and the overcoat layer", and more specifically, refers to glass with exactly the same constituents and compositional ratio.

In addition, the ratio of a crystalline phase with a smaller coefficient of thermal expansion than the coefficient of thermal expansion of the ceramic layers 2 is preferably set to be higher in the overcoat layer 5 than in the ceramic layers 2. As a result, the coefficient of thermal expansion for the overcoat layer 5 is smaller than the coefficient of thermal expansion for the multilayer ceramic substrate 3.

It is to be noted that while the overcoat layer 5 is arranged so as to entirely cover one principal surface of the multilayer ceramic substrate 3 in the laminate type ceramic electronic component 1 shown in FIG. 1, the over coat layer 5 may be formed so as to cover, for example, only sections containing the thick film resistors 4.

Figure 2:
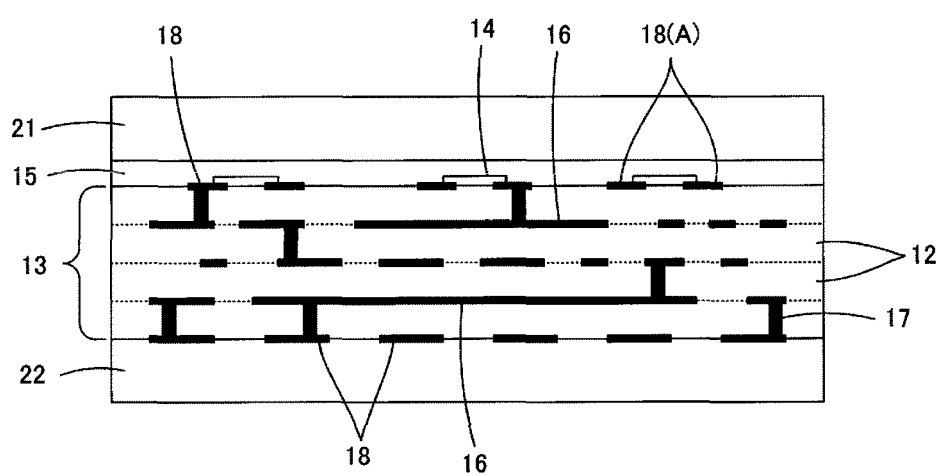
FIG. 2 is a cross-sectional view schematically illustrating an unfired composite laminate 11 prepared for manufacturing the laminate type ceramic electronic component 1 shown in FIG. 1.

A method for manufacturing the laminate type ceramic electronic component 1 described above will be described with reference to FIG. 2. The laminate type ceramic electronic component 1 shown in FIG. 1 is obtained by subjecting an unfired composite laminate 11 shown in FIG. 2 to cofiring.

The unfired composite laminate 11 includes unfired ceramic layers 12 corresponding to the ceramic layers 2, an unfired ceramic laminate 13 corresponding to the multilayer ceramic substrate 3, unfired thick film resistors 14 corresponding to the thick film resistors 4, an unfired overcoat layer 15 corresponding to the overcoat layer 5, unfired in-plane wiring conductors 16 corresponding to the in-plane wiring conductors 6, unfired interlayer connecting conductors 17 corresponding to the interlayer connecting conductors 7, and unfired surface conductors 18 corresponding to the surface conductors 8. In addition, among the unfired surface conductors 18, specific ones refer to unfired resistive connecting conductors 18(A) corresponding to the resistive connecting conductors 8(A).

The unfired composite laminate 11 includes constrained layers 21 and 22 located on each principal surface of thereof. The constrained layers 21 and 22 preferably include, as their main constituent, a ceramic material which is not substantially sintered at a temperature at which the unfired ceramic layers 12 and the unfired overcoat layer 15 are sintered. It is to be noted that any one of the constrained layers 21 and 22 may be omitted to place the other constrained layer only on one principal surface of the unfired composite laminate 11.

In order to manufacture the laminate type ceramic electronic component 1, the unfired ceramic laminate 13 is first prepared which includes the plurality of unfired ceramic layers stacked. The unfired ceramic laminate 13 includes the respective unfired in-plane wiring conductors 16, interlayer connecting conductors 17, and surface conductors 18.

Next, the unfired thick film resistors 14 are formed on one principal surface of the unfired ceramic laminate 13 described above, and the unfired overcoat layer 15 is further formed thereon. Furthermore, the constrained layers 21 and 22 are placed so as to sandwich the unfired ceramic laminate 13 including the unfired thick film resistors 14 and overcoat layer 15. In this way, the unfired composite laminate 11 is obtained.

In the step for manufacturing the unfired composite laminate 11 described above, preferably prepared are ceramic green sheets to serve as the unfired ceramic layers 12, a resistor paste for the formation of the unfired thick film resistors 14, a green sheet for overcoat for the formation of the unfired overcoat layer 15, a conductive paste for the formation of the respective unfired in-plane wiring conductors 16, interlayer connecting conductors 17, and the surface conductors 18, and green sheets for forming constrained layers to serve as the constrained layers 21 and 22, for example.

Then, in order to form the unfired interlayer connecting conductors 17, the specific ceramic green sheets are provided with through holes, which are filled with the conductive paste. In addition, in order to form the respective unfired in-plane wiring conductors 16 and surface conductors 18, the conductive paste is printed onto the specific ceramic green sheets. In addition, in order to form the thick film resistors 14, the resistor paste is printed on the specific ceramic green sheet.

Furthermore, these ceramic green sheets are stacked in a predetermined order to prepare the unfired ceramic laminate 13 including the plurality of unfired ceramic layers 12 stacked. In addition, the green sheet for forming the overcoat is stacked on one principal surface of the unfired ceramic laminate 13 to form the unfired overcoat layer 15. In addition, the green sheets for forming constrained layers are stacked to form the constrained layer 21 and 22.

It is to be noted that for the formation of the unfired overcoat layer 15, in addition to the method of stacking the green sheet for forming the overcoat as a single body, the unfired ceramic laminate 13 may be prepared in such a way that a slurry for the overcoat to serve as the unfired overcoat layer 15 is applied onto the green sheet for forming the constrained layer to serve as the constrained layer 21, the resistor paste for the formation of the unfired thick film resistors 14 and the conductive paste for the formation of the unfired surface conductors 18 are further printed sequentially onto the unfired overcoat layer 15 formed on the green sheet for forming the constrained layer, and the green sheet with the unfired overcoat layer 15 formed thereon and the unfired thick film resistors 14 and unfired surface conductors 18 further formed thereon is then stacked along with the other ceramic green sheets.

Next, the unfired composite laminate 11 is subjected to firing so that the unfired ceramic laminate 13, the unfired thick film resistors 14 and the unfired overcoat layer 15, as well as the in-plane wiring conductors 16, the interlayer connecting conductors 17 and the surface conductors 18, obtained as described above, are integrally sintered. In this firing step, the constrained layers 21 and 22 are not substantially sintered, and thus act to prevent the unfired ceramic laminate 13 and the unfired overcoat layer 15 from being shrunk in the direction of the principal surface. As a result, the resulted laminate type ceramic electronic component 1 has an improved dimensional accuracy.

After the firing step described above, the laminate type ceramic electronic component 1 shown in FIG. 1 is extracted by removing the constrained layers 21 and 22. The constrained layers 21 and 22 are porous upon completion of the firing step, and can be thus removed easily.

In the unfired composite laminate 11, the unfired ceramic layers 12 are preferably made of a glass ceramic material containing glass and a ceramic. In addition, the unfired overcoat layer 15 is made of a glass ceramic material containing a ceramic and glass with substantially the same constituents and compositional ratio as those of the glass contained in the unfired ceramic layers 12.

In this case, as described previously for the sintered ceramic layers 2 and overcoat layer 5, the ceramic contained in the glass ceramic material constituting the unfired overcoat layer 15 may be the same type of a ceramic as, or may be a different type of a ceramic from, the ceramic contained in the glass ceramic material constituting the unfired ceramic layers 12. In addition, the ceramic green sheets for forming the unfired ceramic layers 12 and the green sheet for forming the overcoat for the unfired overcoat layer 15 typically contain a solvent, a dispersant, a binder, and a plasticizer for the preparation of a slurry, and these organic components and the additive amounts thereof may be the same for, or may be different between, the ceramic green sheets and the green sheet for overcoat.

As described above, the ratio of a crystalline phase with a smaller coefficient of thermal expansion than the coefficient of thermal expansion of the fired ceramic layers 2 is higher in the overcoat layer 5 than in the ceramic layers 2. So as to satisfy this condition, the glass ceramic material constituting the unfired ceramic layers 12 and the glass ceramic material constituting the unfired overcoat layer 15 are adjusted.

More specifically, the glass ceramic material constituting the unfired ceramic layers 12 and the glass ceramic material constituting the unfired overcoat layer 15 are adjusted so that the crystallization temperature of the unfired overcoat layer 15 is higher than the crystallization temperature of the unfired ceramic layers 12. More specifically, the crystallization temperatures of the respective layers are preferably adjusted so as to fall within the range of about 920° C. to about 1000° C., and in addition, an adjustment is preferably made so that the crystallization temperature of the unfired overcoat layer is about 2° C. to about 60° C., and more preferably about 5° C. to about 20° C., higher than the crystallization temperature of the unfired ceramic layers, for example.

For example, the unfired ceramic layers 12 and the unfired overcoat layer 15 include a seed crystal containing a crystalline phase deposited in the fired ceramic layers 2 and the overcoat layer 5, and the ratio by weight of the seed crystal in the unfired overcoat layer 15 is preferably set to be lower than the ratio by weight of the seed crystal in the unfired ceramic layers 12. In this case, a sintered body of the same material as the fired ceramic layers 2 is preferably subjected to grinding, and used as the seed crystal. The ratio by weight of the seed crystal is preferably adjusted within the range 0 to about 2.0 weight %, and further about 0.2 weight % to about 1.0 weight % with respect to the total amount of glass and ceramic, for example.

Instead of or in addition to the method described above, a method may be adopted for making the grain size for the ceramic in the unfired overcoat layer 15 smaller than the grain size for the ceramic in the unfired ceramic layers 12.

As described above, the unfired ceramic layers 12 and the unfired overcoat layer 15 using substantially the same glass can thus make it less likely to cause fluctuation in mechanical properties such as the mechanical strength and the coefficient of thermal expansion, or to cause fluctuation in electrical properties such as the Q value and the specific dielectric constant, even when diffusion of the glass is caused between the unfired ceramic layers 12 and the overcoat layer 15. In addition, the same glass raw material can be used for both the ceramic layers 12 and the overcoat layer 15, and the glass raw material can be thus easily managed advantageously in terms of cost.

In addition, in this preferred embodiment, the unfired overcoat layer 15 is preferably formed so as to entirely cover one principal surface of the unfired ceramic laminate 13. In this case, the one constrained layer 21 is brought into contact with the unfired overcoat layer 15, whereas the other constrained layer 22 is brought into contact with the unfired ceramic layer 12. In this case, the unfired overcoat layer 15 and the unfired ceramic layers 12 each using the same glass thus make the respective constraint forces of the two constrained layers 21 and substantially equal to each other, thereby allowing non-shrinkage cofiring to be easily carried out with the use of the constrained layers 21 and 22. This is because the constraint forces provided by the respective constrained layers 21 and 22 depend on the thickness of a reactive layer formed with the glass penetrating into each of the constrained layers 21 and 22.

Next, an experimental example will be described which was carried out to confirm the advantageous effects of various preferred embodiments of the present invention.

A $SiO_2$—$CaO$—$B_2O_3$—$Al_2O_3$ based glass powder, an alumina powder, and an anorthite seed crystal powder were prepared as starting raw materials. It is to be noted that a sintered body (with anorthite deposited) was obtained by forming a glass ceramic powder composed of the $SiO_2$—$CaO$—$B_2O_3$—$Al_2O_3$ based glass powder mixed with the alumina powder into a sheet, stacking the sheet, and subjecting the stacked sheets to firing was subjected to grinding, and used as the anorthite seed crystal powder.

Next, to a mixed powder obtained by compounding the glass powder and the alumina powder with an average grain size of 0.6 μm at a ratio by weight of 56:44 and adding the anorthite seed crystal powder to the glass powder and the alumina powder at such a ratio by weight as providing a crystallization temperature of 935° C., a solvent, a dispersant, a binder, and a plasticizer were added to prepare a slurry, and the slurry was applied onto a PET (polyethylene terephthalate) film to prepare ceramic green sheets to serve as ceramic layers.

On the other hand, a slurry of the alumina powder compounded with a solvent, a dispersant, a binder, and a plasticizer was applied onto a PET film to prepare green sheets for forming constrained layers.

In addition, to a mixed powder adjusted for its crystallization temperature to come to the temperature in Table 1 in such a way that the glass powder was compounded with the alumina powder with such an average grain size as shown in the column "Alumina Grain Size" of Table 1 at a ratio by weight of 56:44, and the anorthite seed crystal powder was added in the range of 0 to 1.0 weight % with respect to 100 weight % in total of the glass powder and alumina powder, a solvent, a dispersant, a binder, and a plasticizer were added to prepare a slurry for overcoat. Then, this slurry for overcoat was applied onto the green sheets for forming constrained layers to prepare green sheets of a two-layer structure.

TABLE 1

| Sample Number | Alumina Grain Size [μm] | Crystallization Temperature [° C.] |
| --- | --- | --- |
| 1 | 0.6 | 920 |
| 2 | 0.6 | 935 |
| 3 | 0.6 | 945 |
| 4 | 0.35 | 930 |
| 5 | 0.35 | 945 |

Next, predetermined ones of the ceramic green sheets were provided with a conductive paste containing Ag as its main constituent in order to form in-plane wiring conductors, interlayer connecting conductors, and surface conductors, and provided with a resistor paste containing $RuO_2$ as its main constituent in order to form thick film resistors.

Next, the multiple ceramic green sheets were stacked with the green sheets for forming constrained layers stacked, including one with the slurry for overcoat applied thereon, and then subjected to pressure bonding, thereby providing an unfired composite laminate.

Next, firing was carried out at a temperature at which the ceramic layers, the overcoat layer, the thick film resistors, and the wiring conductors were sintered sufficiently while the constrained layers were not sintered. The fired composite laminate was subjected to a wet blast treatment to remove the constrained layers on the surfaces, and thereby extract a laminate type ceramic electronic component for a sample.

The thus-obtained laminate type ceramic electronic components for each sample were evaluated for the coefficient of thermal expansion, the crystallization temperature, the deposition ratio of anorthite, and the number of defectives in resistance change, as shown in Table 2.

The ceramic layer section and overcoat layer section of the laminated ceramic electronic component were evaluated for the coefficient of thermal expansion, the crystallization temperature, and the deposition ratio of anorthite. The crystallization temperature was obtained from the top temperature of an exothermic peak by differential scanning calorimetry. The deposition ratio of anorthite indicates a peak intensity ratio between alumina and anorthite, which was obtained by an XRD analysis for each sample, and the higher deposition ratio indicates the higher deposition amount of anorthite.

The number of defectives in resistance change was obtained as follows. For the evaluation of resistance stability, after the thick film resistors were subjected to laser trimming, the rate of resistance change was measured before and after carrying out a 2000-cycle thermal shock test from −40° C. to +150° C. Then, among 30 samples, the number of samples with a rate of resistance change greater than 1% was regarded as the number of defectives in resistance change.

TABLE 2

| | | Coefficient of Thermal Expansion [ppm/K] | Crystallization Temperature [° C.] | Deposition Ratio of Anorthite | The Number of Defectives in Resistance Change |
| --- | --- | --- | --- | --- | --- |
| Ceramic Layer | | 5.9 | 935 | 1.5 | — |
| Overcoat Layer | Sample 1 | 6 | 920 | 1.4 | 3/30 |
| | Sample 2 | 5.9 | 935 | 1.5 | 1/30 |
| | Sample 3 | 5.8 | 945 | 1.7 | 0/30 |
| | Sample 4 | 5.7 | 930 | 2 | 0/30 |
| | Sample 5 | 5.6 | 945 | 2.2 | 0/30 |

As can be seen from Table 2, samples 3 to 5 where the deposition ratio of anorthite for the overcoat layer is higher than the deposition ratio of anorthite for the ceramic layer and the coefficient of thermal expansion for the overcoat layer is lower than the coefficient of thermal expansion for the ceramic layer, resulted in "0/30" for the number of defectives in resistance change, thereby allowing the resistance value to be kept stable even when a thermal shock is applied after laser trimming.

Specifically, in the case of sample 3, the crystallization temperature of the overcoat layer is higher than the crystallization temperature of the ceramic layer, thus, the deposition ratio of anorthite for the overcoat layer is higher than the deposition ratio of anorthite for the ceramic layer, and the coefficient of thermal expansion for the overcoat layer is lower than the coefficient of thermal expansion for the ceramic layer.

In addition, in the case of sample 4, the grain size for the ceramic in the overcoat layer is smaller than the grain size for the ceramic in the ceramic layer, thus, the deposition ratio of anorthite for the overcoat layer is higher than the deposition ratio of anorthite for the ceramic layer, and the coefficient of thermal expansion for the overcoat layer is lower than the coefficient of thermal expansion for the ceramic layer.

Furthermore, in the case of sample 5, the crystallization temperature of the overcoat layer is higher than the crystallization temperature of the ceramic layer and the grain size for the ceramic in the overcoat layer is smaller than the grain size for the ceramic in the ceramic layer, thus, as compared with samples 3 and 4, the deposition ratio of anorthite for the overcoat layer is far higher than the deposition ratio of anorthite for the ceramic layer, and the coefficient of thermal expansion for the overcoat layer is lower than the coefficient of thermal expansion for the ceramic layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a laminate type ceramic electronic component including a thick film resistor formed on one principal surface of a multilayer ceramic substrate including a plurality of ceramic layers stacked on each other, and an overcoat layer formed on the thick film resistor, the method comprising the steps of:

preparing an unfired composite laminate with an unfired thick film resistor formed on one principal surface of an unfired ceramic laminate including a plurality of unfired ceramic layers stacked on each other, and an unfired overcoat layer formed on the unfired thick film resistor; and subsequently firing the unfired composite laminate so that the unfired ceramic laminate, the unfired thick film resistor and the unfired overcoat layer are integrally sintered; wherein the unfired ceramic layers are made of a glass ceramic material containing glass and a ceramic;

the unfired overcoat layer is made of a glass ceramic material including a ceramic and glass with substantially the same constituents and compositional ratio as those of the glass contained in the unfired ceramic layers; and the glass ceramic material constituting the unfired ceramic layers and the glass ceramic material constituting the unfired overcoat layer are adjusted so that a ratio of a crystalline phase with a smaller coefficient of thermal expansion than a coefficient of thermal expansion of the fired ceramic layers is higher in the overcoat layer than in the ceramic layers.

2. The method for manufacturing a laminate type ceramic electronic component according to claim 1, wherein the glass ceramic material constituting the unfired ceramic layers and the glass ceramic material constituting the unfired overcoat layer are adjusted so that the crystallization temperature of the unfired overcoat layer is higher than the crystallization temperature of the unfired ceramic layers.

3. The method for manufacturing a laminate type ceramic electronic component according to claim 2, wherein the unfired ceramic layers and the unfired overcoat layer include a seed crystal containing a crystalline phase deposited in the ceramic layers and the overcoat layer after the firing step, and a ratio by weight of the seed crystal in the unfired ceramic layers and a ratio by weight of the seed crystal in the overcoat layer are adjusted to make the crystallization temperature of the unfired overcoat layer higher than the crystallization temperature of the unfired ceramic layers.

4. The method for manufacturing a laminate type ceramic electronic component according to claim 3, wherein a sintered body of the same material as the ceramic layers after the firing is subjected to grinding, and used as the seed crystal.

5. The method for manufacturing a laminate type ceramic electronic component according to claim 1, wherein a grain size for the ceramic in the unfired ceramic layers and a grain size for the ceramic in the unfired overcoat layer are adjusted to make the crystallization temperature of the unfired overcoat layer higher than the crystallization temperature of the unfired ceramic layers.

6. The method for manufacturing a laminate type ceramic electronic component according to claim 1, wherein the unfired overcoat layer is formed so as to entirely cover the one principal surface of the unfired ceramic laminate.

7. The method for manufacturing a laminate type ceramic electronic component according to claim 1, wherein the unfired composite laminate further includes a constrained layer placed on at least one principal surface of the unfired composite laminate, and the constrained layer contains, as its main constituent, a ceramic material which is not substantially sintered at a temperature at which the unfired ceramic layers and the unfired overcoat layer are sintered, the method further comprising a step of removing the constrained layer after the step of firing the unfired composite laminate.

* * * * *